(12) United States Patent
Meade

(10) Patent No.: US 9,881,932 B2
(45) Date of Patent: Jan. 30, 2018

(54) METHODS OF ADJUSTING FLATBAND VOLUME OF A MEMORY DEVICE

(71) Applicant: MICRON TECHNOLOGY, INC., Boise, ID (US)

(72) Inventor: Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/098,605

(22) Filed: Apr. 14, 2016

(65) Prior Publication Data
US 2016/0225782 A1    Aug. 4, 2016

Related U.S. Application Data

(62) Division of application No. 14/588,659, filed on Jan. 2, 2015, now Pat. No. 9,318,321, which is a division
(Continued)

(51) Int. Cl.
| | | |
|---|---|---|
| *G11C 11/34* | (2006.01) | |
| *H01L 27/11568* | (2017.01) | |
| *H01L 29/423* | (2006.01) | |
| *H01L 29/51* | (2006.01) | |
| *H01L 29/792* | (2006.01) | |
| *H01L 21/02* | (2006.01) | |
| *H01L 27/115* | (2017.01) | |
| *H01L 21/28* | (2006.01) | |
| *H01L 21/326* | (2006.01) | |

(Continued)

(52) U.S. Cl.
CPC .. *H01L 27/11568* (2013.01); *H01L 21/02112* (2013.01); *H01L 21/02318* (2013.01); *H01L 21/28176* (2013.01); *H01L 21/326* (2013.01); *H01L 27/115* (2013.01); *H01L 27/11521* (2013.01); *H01L 29/4234* (2013.01); *H01L 29/51* (2013.01); *H01L 29/7883* (2013.01); *H01L 29/792* (2013.01); *H01L 29/78* (2013.01)

(58) Field of Classification Search
CPC .......... H01L 27/11568; H01L 20/4324; H01L 29/51; H01L 29/792; H01L 21/02112; H01L 27/11521
USPC ......................................... 365/185.18, 185.24
See application file for complete search history.

(56) References Cited

U.S. PATENT DOCUMENTS 3,590,337 A * 6/1971 Wegener ............... G11C 11/403
257/324
3,793,090 A * 2/1974 Barile ............... H01L 21/28185
148/33.3
(Continued)

OTHER PUBLICATIONS

Williams et al., "Low Temperature Diffusion of Alkali Earth Cations in Thin, Vitreous SiO2 Films", The Journal of Electrochemical Society, vol. 142, No. 1, Jan. 1995, pp. 303-311.
(Continued)

*Primary Examiner* — Viet Q Nguyen
(74) *Attorney, Agent, or Firm* — Dicke, Billig & Czaja, PLLC

(57) ABSTRACT

Methods for adjusting a flatband voltage of a memory device, including applying a voltage to a control gate of the memory device such that charged species are moved to one of a plurality of different levels in a dielectric material in response to the voltage, wherein the plurality of different levels is greater than two.

20 Claims, 2 Drawing Sheets

Related U.S. Application Data of application No. 12/829,629, filed on Jul. 2, 2010, now Pat. No. 8,941,171.

(51) Int. Cl.
*H01L 27/11521* (2017.01)
*H01L 29/788* (2006.01)
*H01L 29/78* (2006.01)

(56) References Cited

U.S. PATENT DOCUMENTS

| | | | |
|---|---|---|---|
| 4,090,253 A | 5/1978 | Salgo | |
| 5,260,593 A * | 11/1993 | Lee | G11C 16/0416 |
| | | | 257/316 |
| 5,559,351 A * | 9/1996 | Takiyama | H01L 21/28185 |
| | | | 257/324 |
| 5,830,575 A | 11/1998 | Warren et al. | |
| 6,140,157 A | 10/2000 | Warren et al. | |
| 6,159,829 A | 12/2000 | Warren et al. | |
| 6,566,281 B1 * | 5/2003 | Buchanan | H01L 21/823857 |
| | | | 257/E21.269 |
| 7,113,431 B1 * | 9/2006 | Hamilton | G11C 11/5671 |
| | | | 365/185.02 |
| 7,242,049 B2 | 7/2007 | Forbes et al. | |
| 7,277,314 B2 | 10/2007 | Busta | |
| 9,318,321 B2 * | 4/2016 | Meade | H01L 21/02112 |
| 2004/0004251 A1 * | 1/2004 | Madurawe | H01L 27/0688 |
| | | | 257/347 |
| 2004/0147137 A1 * | 7/2004 | Hiraiwa | H01L 21/28185 |
| | | | 438/778 |
| 2005/0167734 A1 * | 8/2005 | She | H01L 21/28202 |
| | | | 257/321 |
| 2005/0232051 A1 * | 10/2005 | Pan | H01L 21/28273 |
| | | | 365/222 |
| 2005/0238889 A1 | 10/2005 | Iwamoto et al. | |
| 2005/0276143 A1 | 12/2005 | Busta | |
| 2006/0022252 A1 * | 2/2006 | Doh | H01L 29/792 |
| | | | 257/314 |
| 2006/0113586 A1 * | 6/2006 | Wang | H01L 29/513 |
| | | | 257/324 |
| 2006/0198216 A1 * | 9/2006 | Park | G11C 8/08 |
| | | | 365/200 |
| 2006/0284082 A1 * | 12/2006 | Furnemont | G11C 16/0475 |
| | | | 250/307 |
| 2007/0042547 A1 * | 2/2007 | Kikuchi | H01L 21/2807 |
| | | | 438/257 |
| 2007/0232041 A1 * | 10/2007 | Choi | B82Y 10/00 |
| | | | 438/585 |
| 2007/0267621 A1 | 11/2007 | Ufert | |
| 2008/0150003 A1 * | 6/2008 | Chen | H01L 29/42324 |
| | | | 257/324 |
| 2009/0146202 A1 * | 6/2009 | Leong | G11C 13/0014 |
| | | | 257/315 |
| 2009/0236632 A1 * | 9/2009 | Anderson | H01L 29/42384 |
| | | | 257/190 |
| 2009/0286333 A1 | 11/2009 | Kozasa et al. | |
| 2011/0134958 A1 | 6/2011 | Arora et al. | |
| 2011/0182108 A1 | 7/2011 | Williams et al. | |
| 2012/0012919 A1 * | 1/2012 | Kan | B82Y 10/00 |
| | | | 257/316 |
| 2012/0025287 A1 | 2/2012 | Golubovic | |
| 2013/0049119 A1 * | 2/2013 | Huang | H01L 21/823857 |
| | | | 257/351 |

OTHER PUBLICATIONS

Fleetwood et al., "Nonvolatile Memory Based on Mobile Protons", 1998 Int'l NonVolatile Memory Technology Conference, 1998 IEEE, pp. 91-94.

Warren et al., "Protonic Nonvolatile Field Effect Transistor Memories in Si/SiO2/Si Structures", IEEE Transactions on Nuclear Science, vol. 44, No. 6, Dec. 1997, pp. 1789-1793.

Linder et al., "Growth and Scaling of Oxide Conduction after Breakdown", 41st Annual International Reliability Physics Symposium, Dallas, Texas, 2003 IEEE, pp. 402-405.

Stukov et al., "Exponential ionic drift: fast switching and low volatility of thin-film memristors", Applied Physics A: Materials Science and Processing, Nov. 2008, pp. 515-519.

* cited by examiner

METHODS OF ADJUSTING FLATBAND VOLTAGE OF A MEMORY DEVICE

RELATED APPLICATION

This application is a Divisional of U.S. patent application Ser. No. 14/588,659, titled "METHODS OF FABRICATING MEMORY DEVICES HAVING CHARGED SPECIES" filed on Jan. 2, 2015, and issued as U.S. Pat. No. 9,318,321 on Apr. 19, 2016, which is a Divisional of U.S. patent application Ser. No. 12/829,629, titled "FLATBAND VOLTAGE ADJUSTMENT IN A SEMICONDUCTOR DEVICE," filed Jul. 2, 2010, and issued as U.S. Pat. No. 8,941,171 on Jan. 27, 2015, which is commonly assigned and incorporated herein by reference in its entirety.

TECHNICAL FIELD

The present embodiments relate generally to adjustment of a flatband voltage in a semiconductor device.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A flash memory device is a type of memory in which the cells are typically grouped into blocks that can be erased and reprogrammed in blocks instead of one byte at a time. Changes in threshold voltage of the memory cells, through erasing or programming of charge storage structures (e.g., floating gates or charge traps) or other physical phenomena (e.g., phase change or polarization), determine the data value of each cell. The data in a cell of this type is determined by the presence or absence of the charge in the charge storage structure.

A typical flash memory cell comprises a semiconductor on which a dielectric material is formed. The charge storage structure is formed in or adjacent to the dielectric material and a control gate is formed on the dielectric material to control operation of the memory cell. Typical prior art programming uses either Fowler-Nordheim tunneling or hot electron injection to move a charge from a channel in the semiconductor onto the charge storage structure. This type of programming can result in a number of problems.

For example, in order to move the electrons through the dielectric material, a relatively large programming voltage is used (e.g., 20V). Thus, charge pump circuitry is typically used in order to generate the relatively large programming voltages. This circuitry takes up valuable real estate on the integrated circuit. Also, the mechanism by which the electrons tunnel through the tunnel dielectric material damages the dielectric. This limits the number of program/erase cycles that a flash memory device can endure before the dielectric wears out and loses its insulating properties. The memory device then loses its retention capability.

For the reasons stated above, and for other reasons stated below that will become apparent to those skilled in the art upon reading and understanding the present specification, there is a need in the art for a relatively lower voltage memory that can endure a greater number of program/erase cycles.

DETAILED DESCRIPTION

Figure 1:
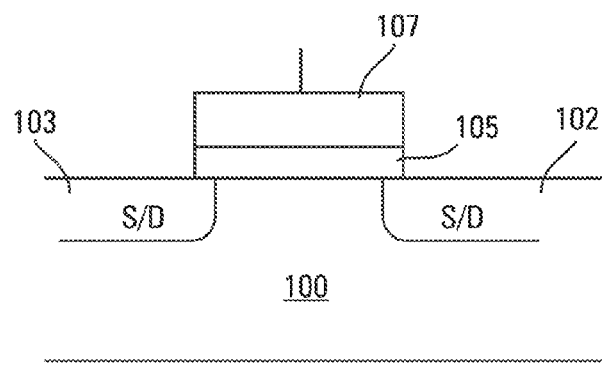
FIG. 1 shows a cross-sectional view of one embodiment of a metal oxide semiconductor field effect transistor.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a cross-sectional view of one embodiment of a metal oxide semiconductor field effect transistor (MOSFET). MOSFET is a generic term in the art to describe types of transistors that, at least initially, were formed with metal gates. Even though more recent FET's use a polysilicon gate, these transistors are still referred to as MOSFET's in the art.

The transistor comprises a pair of source/drain regions 102, 103 formed in a semiconductor 100 (e.g., a monocrystalline silicon substrate), a dielectric material 105 formed adjacent to (e.g., on and/or over) the semiconductor 100, and a control gate 107 formed adjacent to the dielectric material 105. The illustrated embodiment incorporates a charged species (e.g., mobile ions) in the dielectric material that adjusts the transistor flatband voltage in response to a voltage on the control gate.

While the present disclosure refers to MOSFET's, the flatband voltage adjustment created by mobile ions in the dielectric material can be used in any MOS semiconductor device. For example, a MOS capacitor might be one such embodiment.

A MOSFET cell that incorporates the mobile ions for flatband voltage adjustment can be used as non-volatile memory cells, as disclosed subsequently. The flatband voltage adjustment can also be used in MOSFET's that are not intended to be used as memory devices. For example, a circuit designer could change the threshold voltage of a transistor to fit a particular design by biasing the transistor control gate with a certain voltage.

The semiconductor 100, in one embodiment, is silicon. Alternate embodiments might use other types of semiconductor materials such as germanium. The source/drain regions 102, 103 can be formed in the semiconductor 100 by doping the semiconductor 100, e.g., by implantation or diffusion. The area in the semiconductor between the source/drain regions 102, 103 can be considered the channel region since a channel forms between the two source/drain regions 102, 103 during transistor operation.

The dielectric material can be formed on the semiconductor between the source/drain regions 102, 103 and over the channel region of the semiconductor 100. The dielectric material can be, for example, any relatively high dielectric constant (e.g., k≥3.9) insulation material. In one embodiment, the dielectric material is silicon dioxide ($SiO_2$). In one embodiment, the dielectric material can be formed to be less than approximately 70 Å thick (e.g., less than 70 Å thick).

As discussed previously, the dielectric material can be doped with mobile ions (e.g., alkali contamination) to provide the ability to adjust the flatband voltage. One example of an ion that is mobile in $SiO_2$ is calcium. An alternate embodiment might use magnesium. The present disclosure is not limited to just these two ions. Alternate embodiments can use any ions that have an energy barrier (e.g., an activation energy of diffusion) greater than about 0.5 eV to about 3.0 eV. Ions with an energy barrier less than 0.5 eV are believed to be too mobile to posses any useful data retention while ions with an energy barrier greater than 3.0 eV are believed to be too hard to write or erase.

A number of methods can be employed to introduce ions into the dielectric material. Ions can be introduced prior to oxide formation (e.g., growth or deposition), during oxide formation, or after oxide formation. The ions can be introduced prior to or during oxide formation by immersing the wafer containing the future transistor into an alkali solution prior to forming the oxide or allowing contact with alkali material during formation of the oxide. The alkali solution can leave the impurities on the semiconductor surface to be introduced during formation of the dielectric material.

The ions can also be introduced after oxide formation, e.g., by ion implantation. For example, it has been shown that implantation and high temperature activation of calcium distributions in silica MOS capacitor film has indicated a positive flatband voltage shift after device annealing at 1100° C. in a nitrogen atmosphere. Calcium would be present as a negative ion in a high activation energy site.

Ions can also be introduced after oxide formation by contacting the oxide with an alkali solution. Immediately after oxide formation, for example, the wafers might be placed in a basic solution of either $Ca(OH)_2$ or $MgCl_2+Mg(OH)_2$ dissolved in deionized water to introduce calcium or magnesium ions, respectively.

The control gate 107 can be formed on the dielectric material 105. The control gate 107 can be one or more conductive materials, e.g., a polysilicon and/or a metal material. Biasing of the control gate 107 can provide control of the flatband voltage of the transistor by repelling the charged species to being adjacent to the semiconductor 100 or attracting the charged species to being adjacent to the control gate 107.

For example, if the MOSFET is being used as a single level cell (SLC) memory cell, the ions being adjacent to the control gate might be one state while the charge being adjacent to the channel region of the semiconductor might be a different state (e.g., a second state). A MOSFET being used as a multiple level cell (MLC) memory cell might move the charge to one of a plurality of different levels of the dielectric material to represent one of a plurality of different states. The expected changes in the flatband voltage can be illustrated by the following equation:

$$V_{FB} = \phi_{MS} - \frac{Q_f}{C_{ox}} - \gamma \frac{Q_m}{C_{ox}} - \gamma \frac{Q_{ot}}{C_{ox}} - \frac{Q_{it}(\phi_s)}{C_{ox}} \quad (1)$$

In equation (1), $V_{FB}$ is the flatband voltage, $\phi_{MS}$ is the semiconductor work function difference, $C_{ox}$ is the MOS capacitance, $Q_f$ is the fixed oxide charge (located near the semiconductor/dielectric interface), $Q_m$ is the mobile oxide charge, $Q_{ot}$ is the tunnel dielectric trapped charge, $Q_{it}$ is the trapped interface charge and $\gamma$ is the charge distribution factor. The work function can be defined as the minimum energy (usually measured in electron volts) needed to remove an electron from a solid to a point immediately outside the solid surface.

The effect on the flatband voltage is greatest when then charge is located near the semiconductor/dielectric interface since the charge is then imaged in the semiconductor. When the charge is located at the gate/dielectric interface, the charge is imaged in the gate which has little to no effect on the flatband voltage. If the charge is near the polysilicon gate/tunnel dielectric interface, then $\gamma=0$. If the charge is near the semicondoctor/dielectric interface, then $\gamma=1$. The charge can also be moved to some location between the gate and the semiconductor so that $0<\gamma<1$. Replacing $\gamma$ in equation (1) above with these values shows how $V_{FB}$ changes as the charge moves within the dielectric material.

In one embodiment, the charged species is a positively charged ion (i.e., cation) so that a negative voltage on the control gate attracts the charge and a positive voltage repels the charge. In another embodiment, the charged species is a negatively charged ion (i.e., anion) so that the opposite is true. In one embodiment, the mobile ion is a non-hydrogenous ion.

For desired operation of a MOSFET to operate as a memory device, the ion should be mobile within the dielectric material without being too mobile. An ion that is not mobile enough will require a relatively large voltage on the control gate in order to move the charge to program the MOSFET. An ion that is too mobile will move even after the voltage on the control gate is removed, reducing its usefulness as a memory device.

Figure 2:
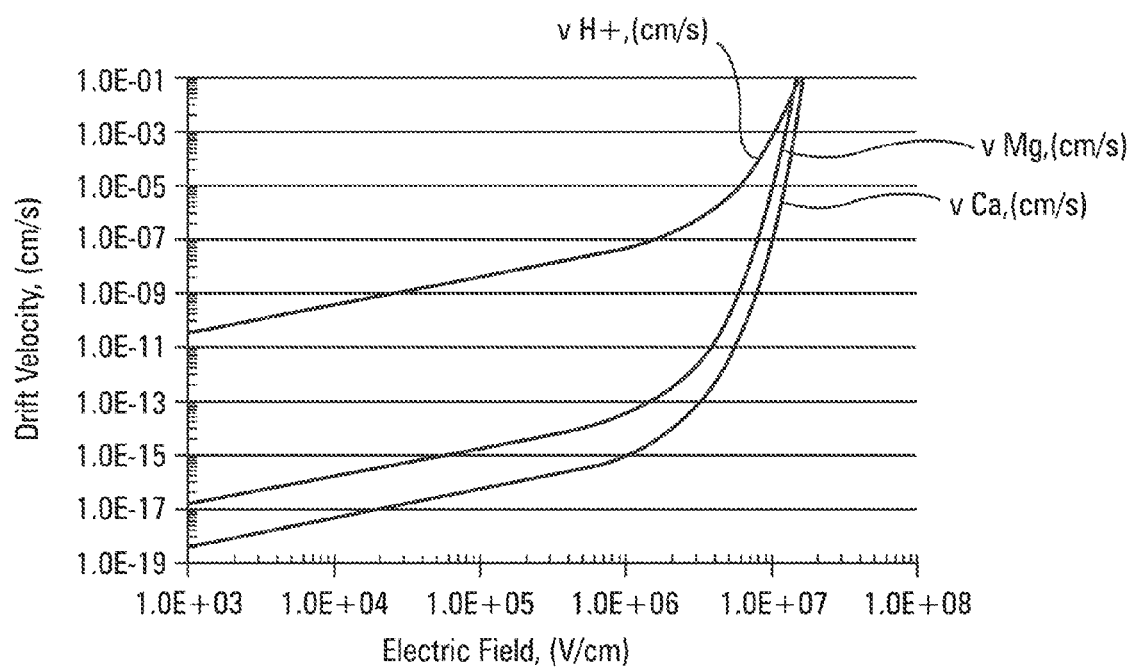
FIG. 2 shows a diagram of one embodiment of expected drift velocity of calcium and magnesium ions compared to hydrogen ions in silicon dioxide at different electric field strengths.

FIG. 2 illustrates a plot of electric field versus the drift velocity of calcium (Ca) and magnesium (Mg) ions as compared to hydrogen ions in a silicon dioxide dielectric material. This plot was generated from the equation:

$$v_D \approx vd\exp\left[-\frac{E_a}{k_BT}\right]\sinh\left[\frac{|z|qdE}{2k_BT}\right] \quad (2)$$

In equation (2), $\upsilon$ is the attempt frequency, d is the jump distance, $E_a$ is the potential barrier, $k_B$ is the Boltzman Constant, T is the absolute temperature, z is the charge number of the ion, q is the elementary charge, and E is the electric field. Calcium has the following values: $\upsilon=2.97$ E+10 Hz, d=5.30 E−10 m, $E_a=1.121273$ eV, $k_B=1.38$ E−23 J K−1, T=300 K, q=1.60 E−19 C, z=2 ionic charge. Magnesium has substantially the same values as calcium except $\upsilon=1.04$ E+11 Hz and $E_a=1.060351$ eV. Hydrogen has substantially the same values as calcium and magnesium except $\upsilon=1.04$ E+11 Hz, $E_a=0.8$ eV, and z=1 ionic charge. These values were plotted in FIG. 2 to illustrate the mobility of both calcium and magnesium at various electric field strengths.

FIG. 2 shows that calcium and magnesium ions have six orders of magnitude better data retention than hydrogen. Additionally, hydrogen is well know for being very reactive and could get caught at the interface of the semiconductor/dielectric if it binds to a paramagnetic dangling bond. The calcium and magnesium ions are used for purposes of illustration only as alternate embodiments can use other ions, e.g., those with an activation energy of diffusion greater than the activation of hydrogen in the dielectric material (e.g., about 0.5 eV in silicon dioxide).

In operation, a MOS memory device can be programmed by biasing the control gates of each MOSFET memory cell being programmed with a programming voltage (e.g., 4V). In one embodiment, this is a positive voltage. In order to read the programmed memory cell, a read voltage (e.g., <1V) is applied to the control gate of the desired memory cell. The magnitude of the read voltage can be determined by the threshold voltage of the memory cell.

Unlike a flash memory cell, the MOSFET memory cell does not need to be erased prior to being reprogrammed. For example, in an MLC MOSFET memory cell that was programmed with certain threshold voltage by moving the charged species, reprogramming encompasses simply applying another either positive or negative voltage to the control gate. This moves the charged species to another location in the dielectric material, thus changing the flatband voltage (i.e., threshold voltage) of the device.

Figure 3:
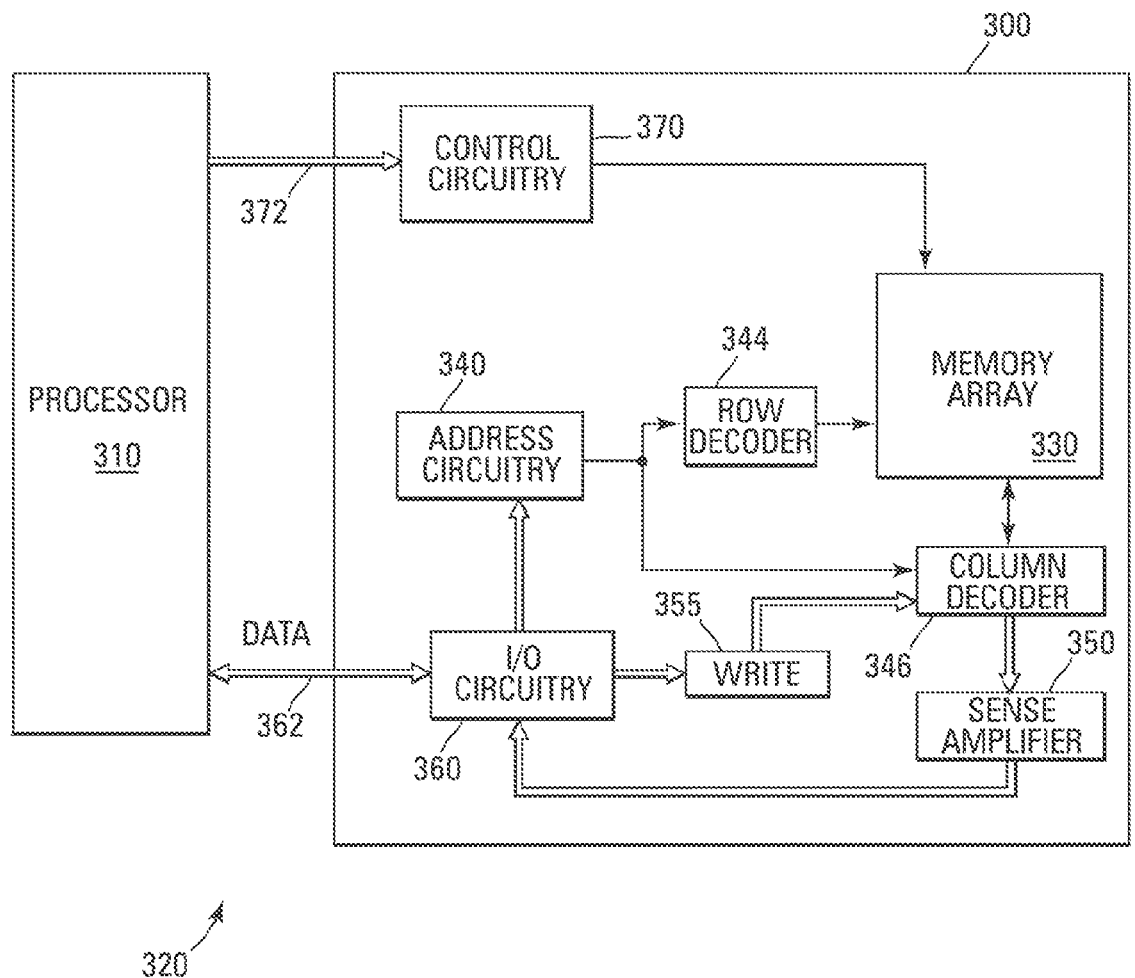
FIG. 3 shows a block diagram of one embodiment of a memory system that can incorporate the memory array with local sense circuits of the present embodiments.

FIG. 3 illustrates a functional block diagram of a memory device 300. The memory device 300 is coupled to an external processor 310. The processor 310 may be a microprocessor or some other type of controller. The memory device 300 and the processor 310 form part of a memory system 320. The memory device 300 has been simplified to focus on features of the memory that are helpful in understanding the present embodiments.

The memory device 300 includes an array 330 of MOSFET memory cells as described previously. The memory array 330 is arranged in banks of word line rows and bit line columns. In one embodiment, the columns of the memory array 330 comprise series strings of memory cells.

Address buffer circuitry 340 is provided to latch address signals provided through I/O circuitry 360. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense amplifier circuitry 350. The sense amplifier circuitry 350, in one embodiment, is coupled to read and latch a row of data from the memory array 330. Data input and output buffer circuitry 360 is included for bidirectional data communication as well as the address communication over a plurality of data connections 362 with the controller 310. Write circuitry 355 is provided to write data to the memory array.

Memory control circuitry 370 decodes signals provided on control connections 372 from the processor 310. These signals are used to control the operations on the memory array 330, including data read, data write (program), and erase operations. The memory control circuitry 370 may be a state machine, a sequencer, or some other type of controller to generate the memory control signals. In one embodiment, the memory control circuitry 370 is configured to control voltages applied to control gates of the memory cells for reading and writing data to the memory cells.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, one or more embodiments of the flatband voltage adjustment in a MOS device can be accomplished by doping a dielectric material with a charged species that is mobile within the dielectric material. The charged species can then be moved in response to a voltage on a control gate of the device, thus adjusting the flatband voltage of the device. In one embodiment of a MOSFET, the flatband voltage is approximately equal to the threshold voltage of the device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for adjusting a flatband voltage of a memory device, the method comprising:

applying a voltage to a control gate of a transistor of the memory device such that charged species are moved to one of a plurality of different levels in a dielectric material of the transistor in response to the voltage, wherein the plurality of different levels is greater than two, wherein a first level of the plurality of different levels is located in the dielectric material nearer a semiconductor forming a channel region of the transistor than each remaining level of the plurality of different levels, wherein a second level of the plurality of different levels is located in the dielectric material nearer the control gate of the transistor than each of the remaining levels of the plurality of different levels, and wherein each of the remaining levels of the plurality of different levels is located at a respective and different position in the dielectric material between the first level and the second level.

2. The method of claim 1, wherein each different level represents a respective one of a plurality of different states.

3. The method of claim 1, wherein the flatband voltage of the memory device is representative of a threshold voltage of the transistor of the memory device.

4. The method of claim 1, wherein the first level is located adjacent to an interface of the semiconductor and the dielectric material and corresponds to a first state of the transistor, and wherein the second level is located adjacent to an interface of the control gate and the dielectric material and corresponds to a second state of the transistor.

5. The method of claim 4, wherein the first level is configured to have a greater effect on the flatband voltage than the second level.

6. The method of claim 1, wherein adjusting the flatband voltage of the memory device comprises adjusting the flatband voltage of the transistor.

7. The method of claim 6, wherein adjusting the flatband voltage of the transistor comprises adjusting the flatband voltage of a memory cell of the memory device comprising the transistor.

8. The method of claim 1, wherein moving the charged species in the dielectric material comprises moving charged species having an activation energy of diffusion within the dielectric material of greater than or equal to 0.5 eV.

9. The method of claim 8, wherein moving the charged species in the dielectric material further comprises moving charged species having an activation energy of diffusion within the dielectric material of less than or equal to 3.0 eV.

10. The method of claim 1, wherein moving the charged species in the dielectric material further comprises moving charged species having an activation energy of diffusion within the dielectric material of greater than 0.8 eV and less than or equal to 3.0 eV.

11. A method for adjusting a flatband voltage of a transistor, the method comprising:
applying a voltage to a control gate of the transistor such that non-hydrogenous ions in a dielectric material of the transistor are moved to one of a plurality of different levels in the dielectric material between the control gate and a semiconductor material in response to the voltage;
wherein the plurality of different levels is greater than two; and
wherein each level of the plurality of different levels is located in the dielectric material at a different distance from the control gate than each remaining level of the plurality of different levels.

12. The method of claim 11, wherein moving the non-hydrogenous ions in the dielectric material comprises moving non-hydrogenous ions of a type selected from a group consisting of anions and cations.

13. The method of claim 11, wherein moving the non-hydrogenous ions in the dielectric material comprises moving the non-hydrogenous ions in silicon dioxide.

14. The method of claim 11, wherein moving the non-hydrogenous ions in the dielectric material comprises moving the non-hydrogenous ions in dielectric material having a dielectric constant of greater than or equal to 3.9.

15. The method of claim 11, wherein applying the voltage to the control gate comprises a voltage selected from a group consisting of a voltage to attract the non-hydrogenous ions toward the control gate and a voltage to repel the non-hydrogenous ions toward the semiconductor material.

16. A method for adjusting a flatband voltage of a memory cell, the method comprising:
applying a voltage to a control gate of the memory cell such that non-hydrogenous ions in a dielectric material of the memory cell and having an activation energy of diffusion within the dielectric material of greater than 0.8 eV are moved to one of a plurality of different levels in the dielectric material between the control gate and a semiconductor material in response to the voltage;
wherein the plurality of different levels is greater than two;
wherein each level of the plurality of different levels is located in the dielectric material at a different distance from the control gate than each remaining level of the plurality of different levels; and
wherein each level of the plurality of different levels corresponds to a respective state to be programmed into the memory cell.

17. The method of claim 16, wherein moving the non-hydrogenous ions having an activation energy of diffusion within the dielectric material of greater than 0.8 eV further comprises moving non-hydrogenous ions having an activation energy of diffusion within the dielectric material of less than or equal to 3.0 eV.

18. The method of claim 16, wherein moving the non-hydrogenous ions comprises moving non-hydrogenous anions.

19. The method of claim 16, wherein moving the non-hydrogenous ions comprises moving cations selected from a group consisting of calcium cations and magnesium cations.

20. The method of claim 19, wherein applying the voltage to the control gate comprises applying a voltage selected from a group consisting of a negative voltage to attract the cations toward the control gate and a positive voltage to repel the cations toward the semiconductor material.

* * * * *